(12) United States Patent
Takahashi

(10) Patent No.: US 7,115,193 B2
(45) Date of Patent: Oct. 3, 2006

(54) SPUTTERING TARGET PRODUCING VERY FEW PARTICLES, BACKING PLATE OR APPARATUS WITHIN SPUTTERING DEVICE AND ROUGHENING METHOD BY ELECTRIC DISCHARGE MACHINING

(75) Inventor: Hideyuki Takahashi, Ibaraki (JP)

(73) Assignee: Nippon Mining & Metals Co., Ltd., (JP)

( * ) Notice: Subject to any disclaimer, the term of this patent is extended or adjusted under 35 U.S.C. 154(b) by 143 days.

(21) Appl. No.: 10/467,809

(22) PCT Filed: Dec. 19, 2001

(86) PCT No.: PCT/JP01/11139

§ 371 (c)(1),
(2), (4) Date: Aug. 11, 2003

(87) PCT Pub. No.: WO02/072911

PCT Pub. Date: Sep. 19, 2002

(65) Prior Publication Data

US 2004/0065545 A1  Apr. 8, 2004

(30) Foreign Application Priority Data

Mar. 14, 2001 (JP) ............... 2001-071834
Apr. 4, 2001 (JP) ............... 2001-105601

(51) Int. Cl.
*C23C 14/34* (2006.01)
*B23H 1/00* (2006.01)

(52) U.S. Cl. ............... 204/298.11; 204/298.12; 219/68; 219/69.11; 216/12; 216/96; 216/100; 216/101; 216/102

(58) Field of Classification Search .......... 204/298.12, 204/298.11, 298.14; 216/12, 96, 100, 101, 216/102; 219/68
See application file for complete search history.

(56) References Cited

U.S. PATENT DOCUMENTS 5,632,869 A * 5/1997 Hurwitt et al. ........ 204/192.12
6,506,312 B1 * 1/2003 Bottomfield ................ 216/11

FOREIGN PATENT DOCUMENTS

JP 09-038831 2/1997
JP 11-131224 * 5/1999

OTHER PUBLICATIONS

Machine Translation of 11-131224.*
Tatsuo Asamaki, Hakumaku Sakusei no Kiso (3$^{rd}$ edition), The Nikkan Kogyo Shimbun, Ltd., pp. 136-144, Mar. 1996, (includes partial English translation of p. 139 under the subheading "The Effect of Etching").
Patent Abstracts of Japan, One page English Abstract of JP 11-131224.
Patent Abstracts of Japan, One page English Abstract of JP 09-038831.

* cited by examiner

*Primary Examiner*—Rodney G. McDonald
(74) *Attorney, Agent, or Firm*—Howson and Howson

(57) ABSTRACT

Provided is a sputtering target, backing plate or apparatus inside a sputtering device in which an electrical discharge machining mark is formed on the face to which unwanted films during sputtering are deposited, and the electrical discharge machining mark is formed from numerous inclined protrusions having a depression angle of less than 90°. When necessary, chemical etching is further performed to the portions subject to such electrical discharge machining. Thereby, the separation and flying of deposits arising from the face to which unwanted films of the target, backing plate and apparatus inside the sputtering device are deposited can be prevented.

14 Claims, 5 Drawing Sheets

SPUTTERING TARGET PRODUCING VERY FEW PARTICLES, BACKING PLATE OR APPARATUS WITHIN SPUTTERING DEVICE AND ROUGHENING METHOD BY ELECTRIC DISCHARGE MACHINING

FIELD OF THE INVENTION

The present invention pertains to a sputtering target, a backing plate or a component inside a sputtering device producing few particles, and a roughening method by electrical discharge machining capable of preventing the separation of a re-deposited film or a deposited film and suppressing the generation of particles by performing roughening processing with electrical discharge machining or performing roughening processing with electrical discharge machining and chemical etching to the non-erosion portion to which the redeposited film of the sputtering target surface is to be deposited, or the portion to which the deposited film inside the sputtering device is unnecessarily formed, as well as the vicinity thereof.

BACKGROUND OF THE INVENTION

In recent years, the sputtering method capable of easily controlling the film thickness and components is being widely used as one of the deposition methods of materials for electronic and electric components.

This sputtering method makes a substrate, which is formed of a positive electrode and a negative electrode, and a target face each other and applies a high voltage between such substrate and target under an inert gas atmosphere in order to generate an electric field, and employs the fundamental principle in which plasma is formed upon the atoms ionized at such time colliding with the inert gas, the positive ions within this plasma colliding with the target (negative electrode) surface and discharging the atoms structuring the target, whereby the film is formed by the discharged atoms adhering to the opposing substrate surface.

Upon forming a thin film with this sputtering method, the problem of the production of particles has been attracting attention. In terms of particles caused by the target during the sputtering method, for example, the thin film is deposited within the walls of the thin film forming device and all over the materials and the like therein, in addition to the substrate, when a target is sputtered.

Faces and side faces other than the erosion portion of the target are no exceptions, and the deposits of sputtered particles have been observed.

And, flakes separating from such materials and the like within the thin film forming device directly flying on the substrate surface is considered to be one of the major causes for the production of particles.

Recently, while the degree of integration of LSI semiconductor devices has increased (64 MB, 256 MB and even 1 GB) on the one hand, it is also becoming miniaturized with the wiring width rule being less than 0.2 µm in some cases, and problems such as the disconnection and short circuit of wiring due to the foregoing particles now occur more frequently.

As described above, the production of particles is now even a larger problem pursuant to the advancement of high integration and miniaturization of electronic device circuits.

Generally, a sputtering target is connected to a backing plate having a larger measurement with such means as welding, diffusion bonding or soldering. From the perspective of the stabilization of sputtering, however, the side face of the sputtering target to be connected to the backing plate is usually formed to have an inclined face broadening toward such backing plate.

As publicly known, a backing plate plays the role of cooling the target by the back face thereof contacting a coolant, and materials such as aluminum or copper or the alloys thereof having a favorable thermal conductivity are used.

The side face of the foregoing sputtering target is not the portion which will erode (become subject to wear) from sputtering. Nonetheless, since it is close to the erosion face of the target, there is a trend toward the sputtered particles flying during the sputtering operation further adhering and depositing thereto.

In general, the erosion face of a sputtering target has a smooth surface from the turning process, and the foregoing inclined side face is similarly subject to the turning process. Whereas, it has become known that the sputtered particles (deposits) once adhered to the inclined side face are separated therefrom once again, float, and cause the production of particles.

In light of the demands of the high integration and miniaturization of electronic device circuits as described above, and in order to overcome the foregoing problems, a proposal has been made of roughening the surface of the target, backing plate as well as the apparatus inside the sputtering device through blast processing (for example, Japanese Patent Laid-Open Publication No. H9-176843), formation of spray coating film (for example, Japanese Patent Laid-Open Publication No. H9-176842), knurling processing (for example, Japanese Patent Laid-Open Publication No. H10-330971), etching processing, electrical discharge machining (for example, Japanese Patent Laid-Open Publication No. H11-131224) and so on in order to improve the adhesiveness, and to prevent the re-separation of the deposited sputtered particles.

Nevertheless, when performing blast processing to the surface of the target, backing plate as well as the apparatus inside the sputtering device, for instance, in order to improve the adhesiveness with the anchor effect, problems such as the contamination of goods due to the remnants of the blast materials would arise. For example, beads of alumina, zirconia and SiC or the like generally used as the blast material have inferior electrical conduction, and may cause abnormal discharge by a charge-up, and the beads themselves may fall out and contaminate the goods.

Further, there is an additional problem in that the adhesiveness of the adhered particles deposited on the residual blast materials would deteriorate and would become easy to separate, and separation of the adhered film caused by the selective and uneven growth thereof would newly arise, and the fundamental issues could not be resolved.

In view of the above, the present inventors previously proposed a sputtering target producing few particles comprising a sprayed coating having a central line surface roughness of Ra 10 to 20 µm at the side face or the like of the sputtering target (Japanese Patent Application No. 2000-314778).

This technology in itself yielded an effect of preventing the separation of the adhered film and suppressing the generation of particles far superior in comparison to conventional methods. Nevertheless, in the case of such surface processing employing spray coating, there are problems in that it is difficult to control the thickness of the spray deposit, and the spray coated film may separate from the processes and contaminate the goods.

Moreover, in the case of surface roughening with knurling, there are problems in that metal contamination may occur from the knurling tools, and that device components cannot be reused since it is difficult to re-perform knurling processing to components that have already been subjected to knurling processing.

Further, in the case of roughening processing with etching, although a very rough surface can be obtained, there are problems in that the application to complex three-dimensional shapes is difficult, and that the formation of a depression angle to be a solid anchor is difficult in principle.

Meanwhile, there is a possibility that roughening processing with electrical discharge machining may mostly overcome the foregoing problems. Nevertheless, the number one problem with the roughening processing with electrical discharge machining is that the separability resistance of the deposited film with ordinary electrical discharge machining is insufficient.

OBJECT OF THE INVENTION

In view of the foregoing problems, an object of the present invention is to obtain a sputtering target, backing plate, or apparatus inside a sputtering device producing few particles, and a roughening method by electrical discharge machining capable of seeking the improvement of the electrical discharge machining coating, and directly preventing the separation and flying of deposits generating from the face to which unnecessary films of a target, backing plate or other apparatuses inside the sputtering device are deposited, in a more effective manner.

SUMMARY OF THE INVENTION

In order to achieve the foregoing object, as a result of intense study, the present inventors discovered that the generation of particles during deposition could be effectively suppressed by improving the surface formed by electrical discharge machining.

Based on this discovery, the present invention provides:

1. A sputtering target, backing plate or apparatus inside a sputtering device producing few particles in which an electrical discharge machining mark is formed on a face to which unwanted films during sputtering are deposited, wherein the electrical discharge machining mark is formed from numerous inclined protrusions having a depression angle of less than 90°;

2. A sputtering target, backing plate or apparatus inside a sputtering device producing few particles in which an electrical discharge machining mark is formed on a face to which unwanted films during sputtering are deposited, wherein the electrical discharge machining mark is formed from numerous inclined protrusions having a depression angle of less than 90°, and chemical etching is further performed to the portions subjected to the electrical discharge machining;

3. A sputtering target, backing plate or apparatus inside a sputtering device producing few particles according to paragraph 1 or paragraph 2 above, wherein the maximum surface roughness Ry of the surface having the electrical discharge machining mark is 30 µm or more;

4. A roughening method by electrical discharge machining of a face to which unwanted films of a target, backing plate or apparatus inside a sputtering device are deposited during sputtering, wherein electrical discharge machining is performed to the face to which unwanted films of a target, backing plate or apparatus inside a sputtering device are deposited during sputtering in order to form an electrical discharge machining mark formed from numerous inclined protrusions having a depression angle of less than 90°;

5. A roughening method by electrical discharge machining of a face to which unwanted films of a target, backing plate or apparatus inside a sputtering device are deposited during sputtering, wherein electrical discharge machining is performed to the face to which unwanted films of a target, backing plate or apparatus inside a sputtering device are deposited during sputtering in order to form an electrical discharge machining mark formed from numerous inclined protrusions having a depression angle of less than 90°, and chemical etching processing is further performed to the portions subjected to the electrical discharge machining;

6. A roughening method by electrical discharge machining according to paragraph 4 or paragraph 5 above, wherein the maximum surface roughness Ry of the surface having the electrical discharge machining mark is 30 µm or more; and 7. A roughening method by electrical discharge machining according to each of paragraphs 4, 5 and 6 above, wherein electrical discharge machining is performed in a working fluid of pure water or super pure water.

DETAILED DESCRIPTION OF THE PREFERRED EMBODIMENT

Generally, electrical discharge machining is a processing method for drilling or cutting a processee such as metal, and, typically, pursuant to the working of the heat accompanying the discharge generated between the minute protrusions of the processee and the steam pressure of the working fluid resulting from the processee being dipped into a working fluid such as illuminating kerosene and voltage being applied to the adjacent electrode, elimination of the protrusions or projections are repeated to process such processee into a prescribed shape.

Therefore, minute protrusions or projections are formed on the electrical discharge machining face. The present invention reduces the separation of a deposited film or re-deposited film formed during sputtering by employing the anchor effect of such minute irregularities.

The roughening processing by electrical discharge machining may be conducted with a standard electrical discharge machining machine. A pulse power source is generally used as the processing power source, and the required processing shape is obtained by adjusting the voltage, current, pulse waveform, discharging time, working fluid, electrode materials, and so on.

As the electrode, in addition to copper, brass and carbon, in consideration of contamination from the electrode, metal or the like identical with the processee material is used, and, as the working fluid, the foregoing illuminating kerosene, water, liquid glass and so on may be used. Generally, it is necessary for the processee to be a conductive material, and metal or conductive ceramic is used. Nevertheless, when using an electrolytic solution as the working fluid, the nonconductive material may also be formed to have a rough surface by electrical discharge machining.

Generally speaking, although the roughened surface of the electrical discharge machining surface has gentle slope-shaped protrusions, in accordance with the processee material, by appropriately selecting the conditions of electrical discharge machining, an electrical discharge machining mark formed from numerous inclined protrusions having a depression angle of less than 90° according to the present invention can be formed.

With the roughened surface having gentle slope-shaped protrusions generally formed thereon, although it is known that this is significantly inferior to the anchor effect of the irregularities formed with the blast processing described above, the electrical discharge machining mark of the present invention is more superior than the anchor effect of the foregoing blast processing.

Moreover, the present invention further improves the anchor effect by performing chemical etching to the portion subjected to such electrical discharge machining.

Figure 1:
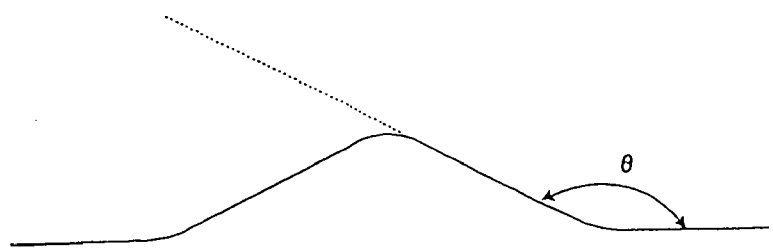
FIG. 1 is a conceptual diagram of the processing mark formed with the generally performed electrical discharge machining.

FIG. 1 illustrates a conceptual diagram of the processing mark formed by electrical discharge machining conducted generally. Regarding the numerous protrusions appearing in the electrical discharge machining mark, as depicted in FIG. 1, the depression angle thereof; that is, the angle θ formed with the parent material surface and the protrusion, has an inclined plane exceeding 90°.

Figure 2:
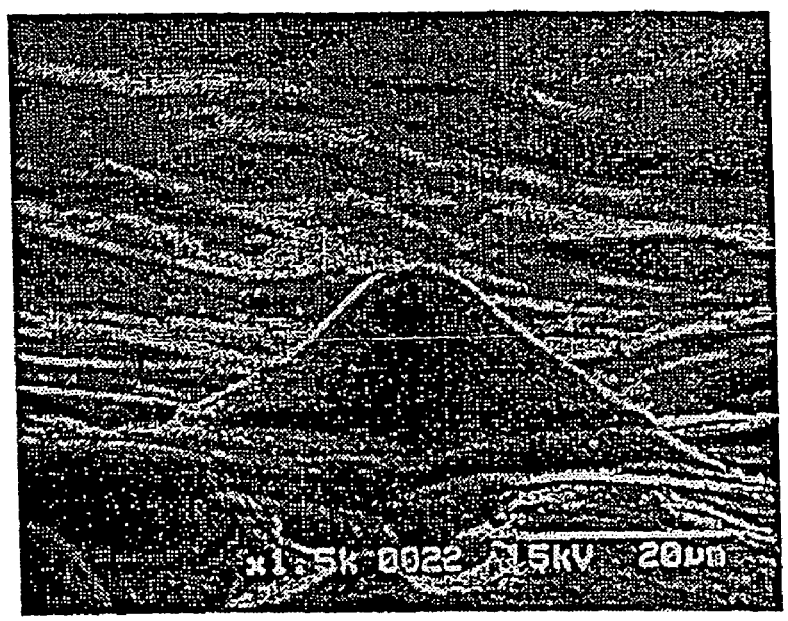
FIG. 2 is an SEM photograph showing the processing mark on the surface formed with the generally performed electrical discharge machining of high purity Ti.

FIG. 2 is an SEM photograph of the surface of the processing mark formed by the generally conducted electrical discharge machining of high purity Ti, and the protrusions appearing in the electrical discharge machining mark present a conical shape having a gentle inclined plane. It is clear that such conical protrusions have a small anchor effect. Moreover, in this case, the electrical discharge machining conditions are of a case of processing with the polarity of the electrodes inverted in comparison to the conditions for forming the electrical discharge machining mark (of the present invention) illustrated in FIG. 4 described later.

Figure 3:
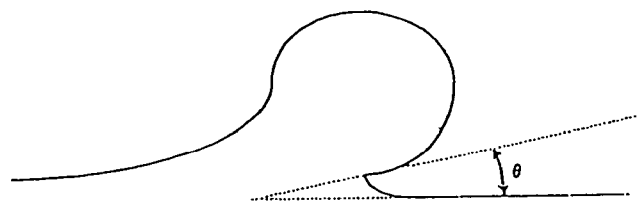
FIG. 3 is a conceptual diagram of an electrical discharge machining mark of the present invention in which one part (one side) is formed from an inclined protrusion having a depression angle of less than 90°.
Figure 4:
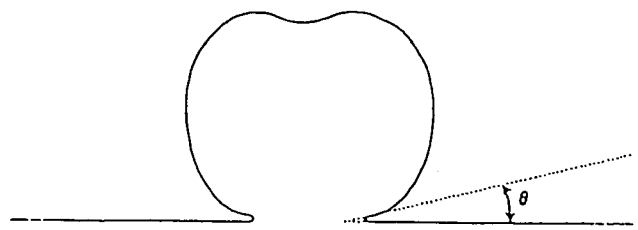
FIG. 4 is a conceptual diagram of an electrical discharge machining mark of the present invention in which the entire periphery is formed from an apple-shaped protrusion having a depression angle of less than 90°.

Contrarily, conceptual diagrams of electrical discharge machining mark of the present invention formed from inclined protrusions having a depression angle of less than 90° are shown in FIG. 3 and FIG. 4. As illustrated in FIG. 3 and FIG. 4, the depression angle of the protrusion; that is, the angle θ formed with the parent material surface and a part or the side face of the entire periphery of the protrusion, has an inclined plane of less than 90°.

Figure 5:
FIG. 5 is an SEM photograph showing the processing mark of the surface subjected to the electrical discharge machining of the present invention.

FIG. 5 is an SEM photograph of the surface in which high purity Ti was subject to electrical discharge machining for 2 minutes and 40 seconds upon employing a carbon electrode under the condition of pulse current 6.5 A and pulse duration 5 μsec in a working fluid of illuminating kerosene. According to this, the electrical discharge machining mark formed from the inclined protrusions (apple shaped) having the depression angle shown in FIG. 4 will be formed. Here, when the pulse duration was extended, this apple-shaped body was formed more easily.

Since electrical discharge machining is processing performed in a working fluid, it is possible that the working fluid may remain on the parent material. Thus, it is necessary to use a working fluid with few impurities, and, in accordance with the condition of contamination or the usage thereof, it is desirable that super pure water without impurities is used, or to newly replace the fluid.

In view of the above, as the working fluid, it is preferable to use pure water, and more preferably super pure water, and pure water or super pure water having a level of impurities less than the target, which is the processee material for instance, may be used. Pure water that is 1 MΩ·cm at the supply port may be used as the working fluid. Regarding super pure water, such water generally referred to as super pure water may be used, and such super pure water in which entire silica of 100 wtppb ($10^{-9}$) or less, resistivity of 14 MΩ·cm or more, and heavy metal of 10 wtppt ($10^{-12}$) or less may be used. Moreover, the resistivity will generally decrease during electrical discharge machining due to the increase of Ti ions and Ti particles.

Such inclined protrusions having a depression angle of less than 90° can be achieved by suitably adjusting the conditions of electrical discharge machining depending on the type of processee material, whereby such protrusions are most commonly seen at the portions where spherical blocks formed when the processing oil that evaporated and is in an expanded state is rapidly cooled, and portions overlapping at the outer ring portion of the crater shaped concave portion formed through arcing.

Such depression angle generates stress pressing in the direction of the parent material side when the sputtered film deposited on the surface subject to electrical discharge machining attempts to separate from the parent material with the thermal stress, and it is thereby possible to prevent such separation. It is desirable that the maximum surface roughness Ry of the surface having the electrical discharge machining mark is 30 μm or more.

Moreover, in order to obtain an electrical discharge machining mark having such a shape, it is necessary to adopt an electrode of a material having a fast processing speed at a high fusing point, and to adjust the polarity and size of the pulse current as well as the pulse duration. It could be said that this kind of electrical discharge machining mark cannot be realized under the processing conditions of ordinary electrical discharge machining.

As a result of the improvement in the surface condition by the foregoing electrical discharge machining, a superior effect is yielded in that it is possible to directly and effectively prevent the separation and flying of deposits generated from the face to which the unwanted films of the target, backing plate or other apparatus inside the sputtering device are deposited, and the generation of particles can thereby be significantly reduced.

The foregoing electrical discharge machining mark of the present invention has advantages unique to electrical discharge machining. That is, even if the parent material surface is rough or if the deposited film is remaining thereon, as with a material that is subject to electrical discharge machining for the first time, it is possible to repeatedly perform electrical discharge machining processing.

This means that the durable hours of the apparatus inside the sputtering device (vacuum device) can be prolonged considerably, and this is extremely important from the perspective of practicability. Nevertheless, since the parent material is being chipped away, there is limitation in that electrical discharge machining cannot be repeated infinitely.

Further, the surface treatment prior to processing may be rough, and there is a characteristic in that the machine processing can be significantly alleviated. Moreover, by devising the electrode shape or processing procedures upon performing electrical discharge machining, a significant advantage is yielded in that an electrical discharge machining mark capable of preventing the separation of the deposited film or re-deposited film can be formed on the surface even with complex three-dimensional shapes that are difficult with spray coating, knurling and etching processing.

In addition to the above, the present invention is able to further improve the anchor effect by performing chemical etching processing to the portions subjected to electrical discharge machining.

The inside of the foregoing spherical (apple-shaped) protrusion formed when the working fluid that evaporated and is in an expanded state from the heat of discharge is rapidly cooled is often hollow, and the surface thereof is melted and in a smooth state.

The outer shell partitioning this cavity from the outer space is extremely thin at some portions. As illustrated with the view of the frame format in FIG. 6, the portions extremely thin at the outer shell portion as a result of etching will break, be in communication with the inside of the cavity, become a complex shape, and further increase the anchor effect thereby.

Figure 7:
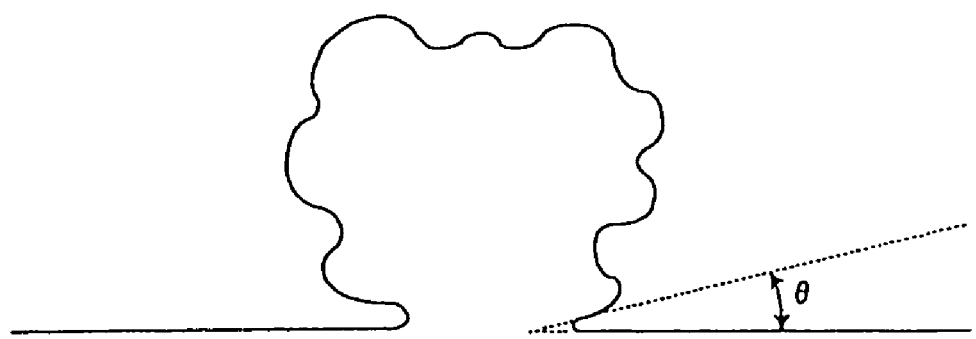
FIG. 7 is a view showing the frame format of an electrical processing mark formed from an apple-shaped protrusion having a depression angle of less than 90° of the present invention and another example in which chemical etching processing was performed thereafter.

Moreover, as a result of etching, as shown in FIG. 7, numerous minute irregularities are formed on the surface of the spherical (apple-shaped) protrusion of the electrical discharge machining mark in which the outer shell is not broken, and the anchor effect will similarly increase.

Figure 8:
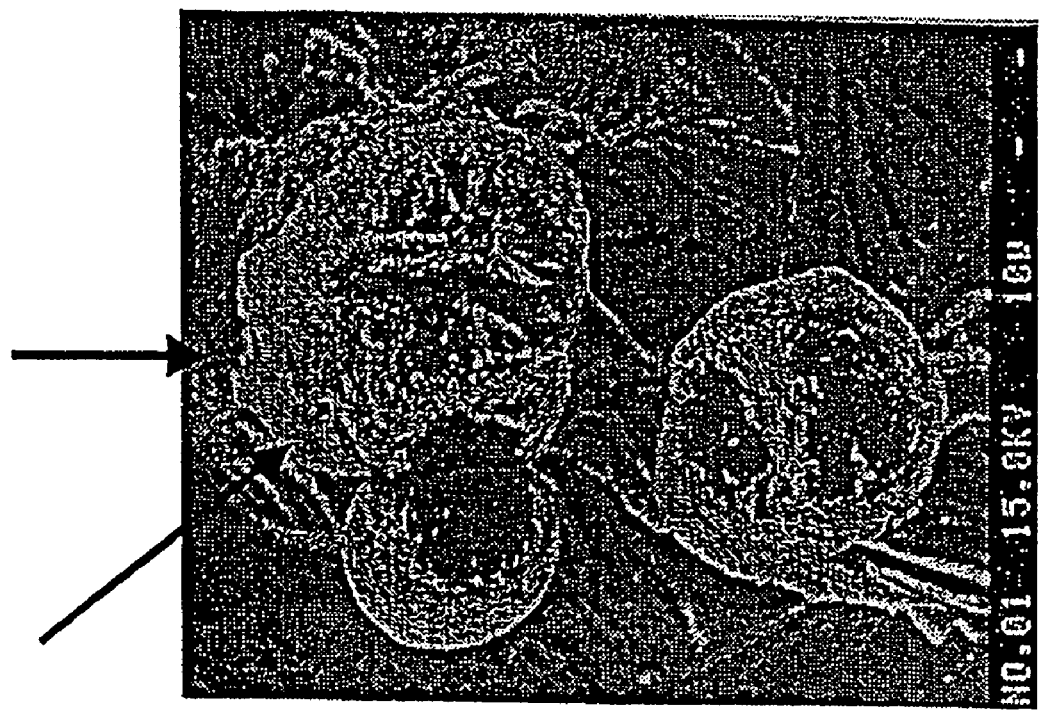
FIG. 8 is an example of the surface SEM image of a state where chemical etching processing was performed after the electrical discharge machining processing of the present invention.

FIG. 8 is a surface SEM image showing a pure Ti sample subject to electrical discharge machining processing under the conditions which realize the shape of FIG. 5 described above being dipped for 10 seconds in a mixed solution of fluorine and nitric acid.

Figure 6:
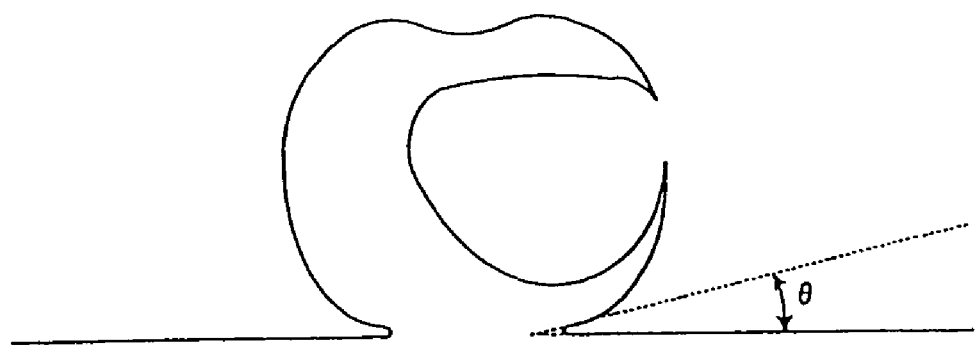
FIG. 6 is a view showing the frame format of an electrical processing mark formed from an apple-shaped protrusion having a depression angle of less than 90° of the present invention and an example in which chemical etching processing was performed thereafter.

The view of a frame format of FIG. 6 shows a state where a through hole (arrow) is formed in the side face of the spherical protrusion.

The crystal structure subject to such electrical discharge machining can be easily subject to the etching fluid, and, therefore, a significant characteristic is yielded in that minute irregularities can be easily formed, etching can be performed easily, and the anchor effect can be increased exponentially.

When applying the processing by electrical discharge machining and the processing by electrical discharge machining and chemical etching of the present invention to a target, for example, such processing may be applied to targets having a shape of a rectangle, circle, and other shapes. Here, it is also effective to perform processing to the side face of the target, which is the non-erosion portion.

Although the target side face is often formed to be an inclined plane, the foregoing processing may also be applied to a sputtering target having a perpendicular face, or a structure of a plane face continuing to such faces. The present invention covers all of the above.

In particular, with respect to the generation of particles from the target side face, although often overlooked, it has been observed that the sputtering particles (deposits) that once adhered are re-separated from the inclined side face of the sputtering target, and such particles float and cause the generation of particles.

In addition, rather than the vicinity of the erosion face of a planar periphery, such separation of deposits occurs frequently at the portions distant therefrom. Therefore, there is a merit in that the application to such side face is extremely easy, and the generation of particles can be effectively suppressed.

Moreover, as the backing plate material, the normally used copper, copper alloy, aluminum, aluminum alloy and the like may be used, and there is no particular limitation. Regarding the apparatus inside the sputtering device, it is not necessary to particularly limit the materials, and the foregoing processing may be performed to stainless as well as the surface of other materials.

When the side face of the sputtering target is of an inclined face, in particular, the present invention may be used for sputtering targets in which the side face thereof to be connected to the backing plate is broadening toward such backing plate.

In particular, with the present invention, it is preferably that the electrical discharge machining or electrical discharge machining and chemical etching of the present invention be performed along the side face of the sputtering target and the face of the backing plate.

As described above, although there will be differences in materials or differences in the resulting thermal expansion between the target side face and backing plate, or clear bumps between the materials that will cause the generation of particles, by performing electrical discharge machining or electrical discharge machining and etching having a further strong anchor effect to such portions, the generation of particles can be effectively prevented.

EXAMPLES AND COMPARATIVE EXAMPLES

Next, the Examples and Comparative Examples of the present invention are explained. The Examples are mere exemplifications of the present invention, and shall not limit the present invention in any way. In other words, modifications and other modes based on the technical spirit of the present invention shall all be included herein.

Examples 1, 2 and Comparative Examples 1 to 4

[Separability Resistance Test]

A pure titanium sample was prepared through electrical discharge machining (EDM), shot blasting and buffing, sputtering was performed to the titanium target under an atmosphere of an ultimate vacuum of $1.3 \times 10^3$ Pa or less, and a pressure atmosphere where the mixed gas of 20 vol % Ar and 80 vol % $N_2$ is 0.8 Pa, and a Ti-N film having a total thickness of approximately 10 μm was deposited on the sample. The processing conditions for EDM was that a carbon electrode be used, and subjecting high purity Ti in the working fluid of illuminating kerosene at a pulse current of 6.5 A, pulse duration of 5 μsec for 2 minutes and 40 seconds.

With respect to Example 1 and Example 2, the surface shape by electrical discharge machining was formed from numerous inclined protrusions (apple shape) having a depression angle of less than 90° within the scope of the present invention, and the surface roughness was Ry 69 μm and Ry 35 μm, respectively. Comparative Example 1 was Ry 55 μm and the surface shape was a mixture of a conical shape and apple shape; Comparative Example 2 was Ry 28 μm and the surface shape was of a conical shape; Comparative Example 3 was subjected to blast processing by SiC #30(Ry was 21 μm); and Comparative Example 4 was subjected to buffing (Ry was 2 μm).

The separability test results are shown in Table 1.

TABLE 1

|  | Processing Method | Ry (μm) | Surface Shape | Results of Separation Test |
|---|---|---|---|---|
| Example 1 | Electrical Discharge Machining | 69 | Apple-shape protrusion having numerous depression angles | No Separation |
| Example 2 | Electrical Discharge Machining | 35 | Apple-shape protrusion having numerous depression angles | No Separation |
| Comparative Example 1 | Electrical Discharge Machining | 55 | Mixture of conical shape and apple shape | Partial Separation |
| Comparative Example 2 | Electrical Discharge Machining | 28 | Numerous conical protrusions | Significant Separation |
| Comparative Example 3 | Blast Processing SiC #30 | 21 | SiC Remnant | Separation from surface of large remnant SiC |
| Comparative Example 4 | Buffing | 2 | Mirror Face | Separation in large measure at film thickness of 5 μm |

As shown in Table 1, separation could not be acknowledged in Example 1 and Example 2. Contrarily, partial separation was acknowledged in Comparative Example 1 where the surface shape was a mixture of a conical shape and apple shape. Moreover, significant separation was acknowledged in the electrical discharge machining mark of a conical shape illustrated in FIG. 2 for Comparative Example 2, and it is now known that separation of the deposited film or re-deposited film will occur with only the formation of a rough surface by merely performing electrical discharge machining.

Further, remnants of SiC could be found in Comparative Example 3, and there was a problem in that separation occurs from the surface of the large remnant SiC. In addition, although a mirror face shape is presented in Comparative Example 4 subjected to buffing, separation occurred in a large measure at the film thickness of 5 μm.

Accordingly, it is clear that the apple-shaped electrical discharge machining mark of the present invention is significantly superior in separability resistance of deposited films or redeposited films.

Example 3 and Comparative Example 5

[Comparative Test of Particle Generation Amount]

Electrical discharge machining was performed under the conditions of Example 1 above to the target side face. Sputtering was performed with the target, and changes in the number of generated particles of 0.2 μm or more was measured in accordance with the integral power consumption.

Simultaneously, the number of generated particles was similarly counted for the case where blast processing was performed to the target side face under the conditions of Comparative Example 3.

The results are shown in Table 2. The numbers shown in Table 2 represent the number of particles in an 8-inch wafer.

As shown in Table 2, although Comparative Example 5 subjected to blast processing showed particle generation in average of 16.2 particles per wafer from 0 to 250 kWh for particles larger than 0.2 μm, with Example 2, a decrease of approximately 25% of 12.1 particles per wafer could be observed.

Accordingly, it is clear that the electrical discharge machining mark of the present invention yields a significant effect for suppressing the generation of particles.

TABLE 2

|  | Example 3 (Electrical Discharge Machining) | | Comparative Example 5 (Blast Processing) | |
|---|---|---|---|---|
| Integral Power | Particle Diameter (μm) | | Particle Diameter (μm) | |
| kWh | 0.3 | 0.2 | 0.3 | 0.2 |
| 01–50 | 6.25 | 21.20 | 9.18 | 27.64 |
| 51–100 | 3.20 | 10.70 | 4.00 | 18.50 |
| 101–150 | 3.30 | 9.00 | 6.00 | 11.80 |
| 151–200 | 2.90 | 8.40 | 3.60 | 10.50 |
| 201–250 | 4.30 | 11.30 | 7.50 | 12.60 |

(Unit: Number of Particles/8-Inch Wafer)

Example 4 and Comparative Examples 6 to 9

[Separability Resistance Test]

A pure titanium sample subjected to electrical discharge machining (EDM) having a spherical (apple-shaped) protrusion was used, and shown are those subjected to etching processing (Example 4), those which were not subjected to any processing (Comparative Example 6), those subjected to shot blast processing (SiC #30 (Comparative Example 7), SiC #100 (Comparative Example 8)) and those subjected to buffing (Comparative Example 9).

Regarding the respective examples, sputtering was performed to the titanium target under an atmosphere of an ultimate vacuum of $1.3 \times 10^3$ Pa or less, and a pressure atmosphere where the mixed gas of 20 vol % Ar and 80 vol % $N_2$ is 0.8 Pa, and a Ti—N film having a total thickness of approximately 100 μm was deposited on the sample. The processing conditions for EDM was that a carbon electrode be used, and subjecting high purity Ti in the working fluid of illuminating kerosene at a pulse current of 6.5 A, pulse duration of 5 μsec for 2 minutes and 40 seconds.

The separation test results are shown in Table 3. Ry in the Table represents the maximum surface roughness (μm).

TABLE 3

|  | Processing Method | Ry μm | Surface Shape | Results of Separation Test |
|---|---|---|---|---|
| Example 4 | Electrical Discharge | 64 | Apple-shape protrusion having | No separation up to 100 μm |

TABLE 3-continued

| | Processing Method | Ry (μm) | Surface Shape | Results of Separation Test |
|---|---|---|---|---|
| | Machining + Etching | | numerous depression angles + irregularities as a result of etching | |
| Comparative Example 6 | Electrical Discharge Machining Only | 67 | Apple-shape protrusion having numerous depression angles | Separation observed at 32 μm |
| Comparative Example 7 | Blast Processing (SiC #30) | 21 | SiC Remnant | Partial separation from surface of large remnant SiC |
| Comparative Example 8 | Blast Processing (SiC #100) | 17 | SiC Remnant | Significant separation at 55 μm |
| Comparative Example 9 | Buffing | 2 | Mirror Face | Separation in large measure at film thickness of 5 μm |

As shown in Table 3, although the pure titanium sample subjected to electrical discharge machining (EDM) having the spherical (apple-shaped) protrusion shape of Comparative Example 6 showed favorable results in the separation test, separation of the Ti—N film could be acknowledged when depositing up to roughly 32 μm.

Contrarily, the sample subjected to etching after the electrical discharge machining (EDM) processing in Example 4 of the present invention did not show any separation of the Ti—N film up to 100 m, and superior separability resistance could be acknowledged. Moreover, Comparative Example 6 was used to show the effects of etching processing, and does not in any way deny the electrical discharge machining processing of the present invention or the significant effects thereof.

By way of reference, SiC remnants, which are blast materials, could be found in a state of being pierced into the sample of Comparative Example 7 and Comparative Example 8 subjected to shot blast processing, a phenomenon of Ti—N films separating at the micro level from the surface of such SiC surface was observed, and, with Comparative Example 8, separation occurred in a large area at 55 μm. Moreover, separation occurred in a large measure at a film thickness of 5 μm with Comparative Example 9 subjected to a buffing finish.

Accordingly, it is clear that the surface subjected to electrical discharge machining and etching processing having an apple-shaped electrical discharge machining mark of the present invention is significantly superior in the separability resistance of deposited films and re-deposited films.

Example 5 and Comparative Example 10

A pure titanium electrode similar to the processee was used, and electrical discharge machining was performed to high purity titanium in a working fluid of super pure water. The results are Example 5, and Comparative Example 10 shows a case of performing electrical discharge machining with illuminating kerosene for comparison.

Conditions for electrical discharge machining were pulse current 6.5 A and pulse duration 8 μsec for 4 minutes.

Figure 9:
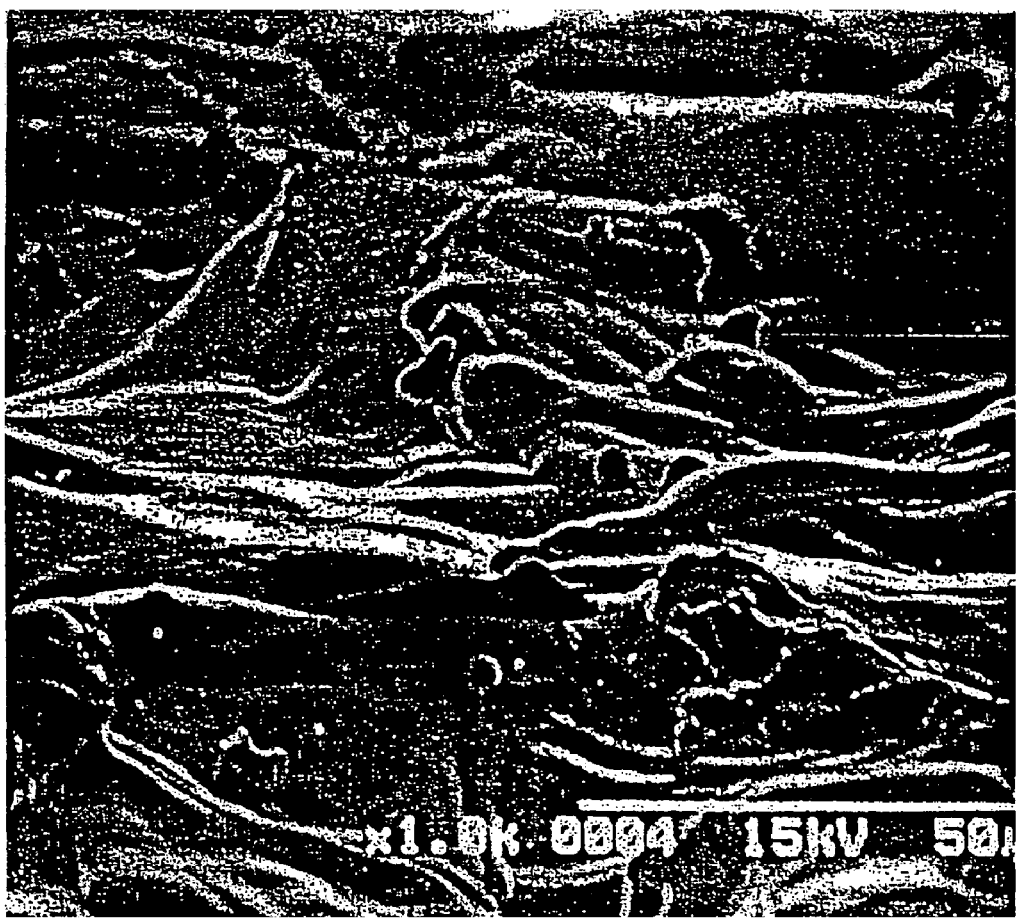
FIG. 9 is an SEM photograph showing the processing mark of the surface in a case of performing electrical discharge machining of the present invention upon using super pure water as the electrical discharge machining fluid.

FIG. 9 shows the surface shape by electrical discharge machining. As shown in FIG. 9, numerous inclined protrusions (apple-shaped) having a depression angle of less than 90° within the scope of the present invention was observed. In addition, the rough surface is even more cluttered and complex.

Further, when using a working fluid of super pure water, as shown in Table 4, impurities are much less in comparison to the case of using illuminating kerosene, and there is a characteristic in that the processee materials are not contaminated. Moreover, regarding O, although this is detected in every case, the detection intensity was much weaker with Example 5 in comparison to Comparative Example 10.

As described above, in Example 5, when performing electrical discharge machining in the working fluid of super pure water, significant effects were confirmed in that contamination is low, and the adhesiveness of the deposited film can be improved.

Moreover, when etching processing similar to Example 4 was performed to this sample, the separability resistance increased even more.

TABLE 4

| | Method of Electrical Discharge Machining | Elements Detected with EPMA (excluding Ti) |
|---|---|---|
| Example 5 | Super pure water + Ti electrode | O |
| Comparative Example 10 | Illuminating kerosene + Ti electrode | C, S, O, Ca, Si |

Through the improvement of electrical discharge machining coating, and pursuant to electrical discharge machining and chemical etching, a significant effect is yielded in that obtained is a sputtering target, backing plate or apparatus inside a sputtering device producing few particles, and a roughening method by electrical discharge machining or a roughening method by electrical discharge machining and chemical etching capable of directly preventing the separation and flying of deposits generating from the face to which unnecessary films of a target, backing plate or other apparatuses inside the sputtering device are deposited, in a more effective manner.

The invention claimed is:

1. A sputtering target, backing plate or apparatus inside a sputtering device producing few particles, said sputtering target, backing plate or apparatus having a face to which unwanted films are deposited during sputtering, an electrical discharge machining mark being formed on said face, wherein said electrical discharge machining mark is formed from numerous inclined, apple-shaped protrusions having a depression angle of less than 90°, and wherein a maximum surface roughness Ry of a surface having said electrical discharge machining mark is 30 μm or more.

2. A sputtering target, backing plate or apparatus according to claim 1, wherein said surface having said electrical discharge machining mark is a chemically etched surface.

3. A roughening method of a face of a target, backing plate or apparatus that is located inside a sputtering device and to which unwanted films are deposited during sputtering, comprising the steps of;
electrical discharge machining the face of the target, backing plate or apparatus,
inverting the polarity between an electrode and the face during said electrical discharge machining step so that numerous inclined, apple-shaped protrusions having a depression angle of less than 90° are formed on the face during said electrical discharge machining and not conical-shaped protrusions which would otherwise be formed in absence of said inverting step, and providing a surface on said face with a maximum surface roughness Ry of 30 μm or more.

4. A method according to claim 3, further comprising the step of chemical etching said face after said electrical discharge machining step.

5. A roughening method according claim 3, wherein said step of electrical discharge machining is performed in a working fluid of pure water.

6. A roughening method according claim 3, wherein said step of electrical discharge machining is performed in a working fluid of pure water containing 100 wt ppb or less silica and 10 wt ppt or less heavy metal and having a resistivity of 14 MΩcm or more.

7. A roughening method according claim 4, wherein said step of electrical discharge machining is performed in a working fluid of pure water.

8. A roughening method according claim 4, wherein said step of electrical discharge machining is performed in a working fluid of pure water containing 100 wt ppb or less silica and 10 wt ppt or less heavy metal and having a resistivity of 14 MΩcm or more.

9. A roughening method according to claim 3, wherein said step of electrical discharge machining is performed utilizing a pulse current of no greater than 6.5A.

10. A roughening method according to claim 3, wherein said step of electrical discharge machining is performed utilizing a pulse duration of at least 5 μsec for at least 2 minutes and 40 seconds.

11. A roughening method according to claim 4, wherein said step of electrical discharge machining is performed utilizing a pulse current of no greater than 6.5A.

12. A roughening method according to claim 4, wherein said step of electrical discharge machining is performed utilizing a pulse duration of at least 5 μsec for at least 2 minutes and 40 seconds.

13. A method of roughening a face of a target, backing plate or apparatus that is located inside a sputtering device and to which unwanted films are deposited during sputtering, comprising the steps of:
  dipping the face in a working fluid adjacent an electrode and thereafter applying a voltage and pulse current to the electrode to electrical discharge machine the face;
  before said applying step, inverting a polarity between the face and the electrode, wherein, before said inverting step, conical-shaped protrusions arc producible on the face, and after said inverting step, apple-shaped protrusions are producible on the face;
  after said inverting step, electrical discharge machining the face so that the face is provided with a maximum surface roughness Ry of 30 μm or more and numerous, inclined, apple-shaped protrusions each having a depression angle of less than 90°.

14. A method according to claim 13, further comprising the step of chemical etching the face after said electrical discharge machining step.

* * * * *